United States Patent
Simon et al.

(10) Patent No.: US 7,746,263 B2
(45) Date of Patent: Jun. 29, 2010

(54) METHOD AND ARRANGEMENT FOR THE DIGITAL TRANSMISSION OF AN ANALOGUE MEASURING SIGNAL

(75) Inventors: Jasmin Simon, Marktrodach (DE); Andreas Greif, Neunkirchen am Brand (DE); Karl-Heinz Winkler, Altdorf/Rasch (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 99 days.

(21) Appl. No.: 12/225,222

(22) PCT Filed: Feb. 22, 2007

(86) PCT No.: PCT/DE2007/000330

§ 371 (c)(1),
(2), (4) Date: Sep. 15, 2008

(87) PCT Pub. No.: WO2007/110017

PCT Pub. Date: Oct. 4, 2007

(65) Prior Publication Data

US 2009/0231177 A1    Sep. 17, 2009

(30) Foreign Application Priority Data

Mar. 22, 2006    (DE) ..................... 10 2006 013 000

(51) Int. Cl.
*H03M 1/56* (2006.01)
(52) U.S. Cl. .................. 341/169; 341/155; 341/170; 327/108; 327/109; 327/110; 327/131; 327/161
(58) Field of Classification Search ......... 341/118–122, 341/155, 169, 170; 327/108, 131, 165, 109, 327/110, 143
See application file for complete search history.

(56) References Cited

U.S. PATENT DOCUMENTS

| 4,257,034 | A  | * | 3/1981  | Wilkinson | .................. 341/118 |
| 5,352,986 | A  | * | 10/1994 | Modgil et al. | ................ 330/10 |
| 6,249,161 | B1 |   | 6/2001  | Pontarollo |  |
| 6,346,907 | B1 |   | 2/2002  | Dacy et al. |  |
| 6,545,624 | B2 | * | 4/2003  | Lee et al. | .................... 341/155 |
| 6,642,690 | B2 | * | 11/2003 | Kim | ......................... 318/811 |
| 6,763,114 | B1 | * | 7/2004  | Nalbant | ..................... 381/120 |
| 6,813,173 | B2 | * | 11/2004 | Lipcsei | ........................ 363/98 |
| 6,920,054 | B2 | * | 7/2005  | Florence et al. | .............. 363/41 |
| 7,078,942 | B2 | * | 7/2006  | Lin | .......................... 327/108 |
| 7,196,651 | B2 |   | 3/2007  | Gude |  |
| 7,528,760 | B2 | * | 5/2009  | Forejt | ........................ 341/166 |
| 7,554,478 | B2 | * | 6/2009  | Lim | .......................... 341/169 |
| 7,554,479 | B2 | * | 6/2009  | Lim | .......................... 341/169 |
| 7,616,147 | B2 | * | 11/2009 | Huang et al. | ................ 341/169 |

FOREIGN PATENT DOCUMENTS

| DE | 103 41 236 | 4/2005 |
| JP | 2004-260311 | 9/2004 |

* cited by examiner

*Primary Examiner*—Linh V Nguyen
(74) *Attorney, Agent, or Firm*—W. F. Fasse; W. G. Fasse

(57) ABSTRACT

The invention relates to a method for the digital transmission of an analogue measuring signal (M), comprising the following steps:

Figure 1:
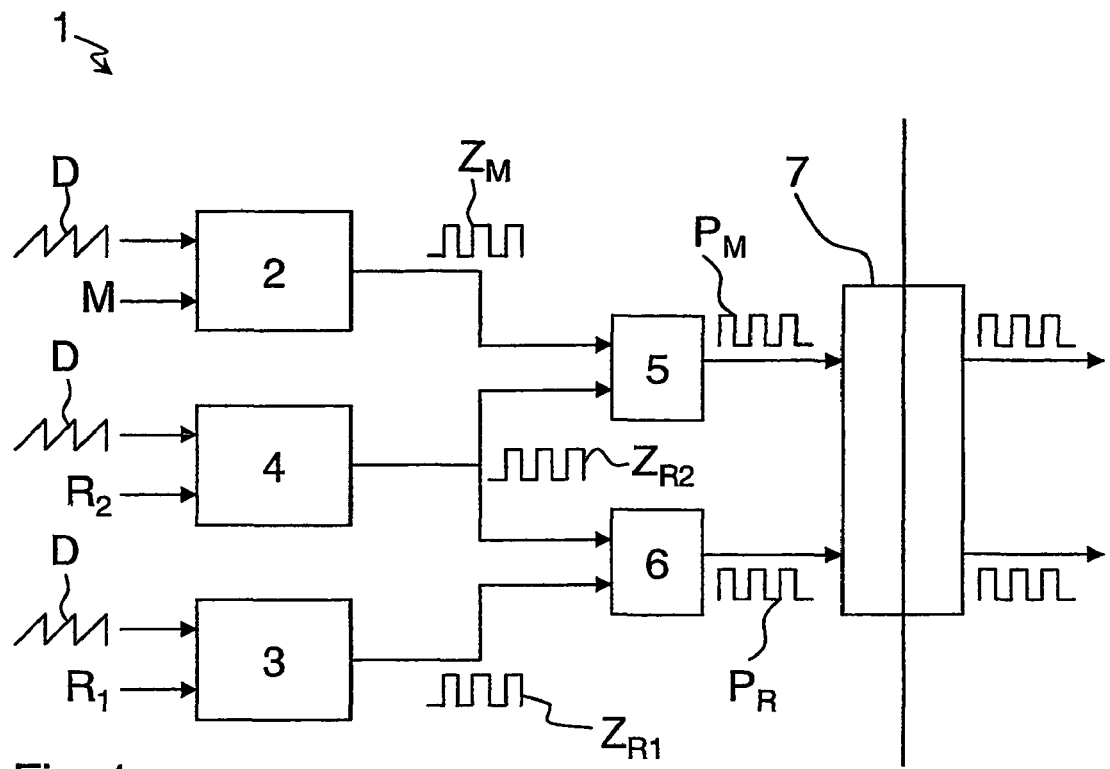

comparing momentary values of a triangular signal (D) with a value of the measuring signal (M) for generating a binary measurement pulse ($P_M$);

comparing momentary values of the triangular signal (D) with a predeterminable first reference variable ($R_1$) for generating a binary reference pulse ($P_R$) that corresponds to the measurement pulse ($P_M$) and transmitting the measurement pulse ($P_M$) and reference pulse ($P_R$) at a constant phase.

18 Claims, 3 Drawing Sheets

METHOD AND ARRANGEMENT FOR THE DIGITAL TRANSMISSION OF AN ANALOGUE MEASURING SIGNAL

The invention relates to a method and an and arrangement for the digital transmission of an analogue measuring signal.

In many electronic applications it is necessary to transmit analogue measuring signals for further processing in the form of digital variables, for example to logic components or microcontrollers. Here, for the transfer to another potential, the digital variable is usually transmitted across a galvanic separation, for example by means of an optocoupler. After the transmission in certain cases the digital variable is to be delivered in analogue form, for example by means of a digital/analogue converter.

When transmitting a digital or analogue variable the accuracy of the transmission is subject to different influences, caused for example by manufacturing tolerances of resistances, condensers or integrated circuits or by temperature and/or pressure fluctuations.

Furthermore, with a digitization in general a quantization error is produced due to the discrete range, so that a quantization noise is applied to the digital variable. Thus, the digital variable is subject to errors in multiple respects. A subsequent digital/analogue conversion thus produces an analogue signal, which comprises a loss of accuracy or information respectively. Moreover, conventional analogue/digital converters are designed in complex manner.

It is the object of the invention to indicate a method and an arrangement for the digital transmission of an analogue measuring signal, which allows for a transmission with low expenditure and low loss of information by component tolerances, frequency changes etc.

The object is solved according to invention by a method, which comprises the features indicated in claim 1, as well as by an arrangement, which comprises the features indicated in claim 12.

Advantageous embodiments of the invention are subject of the respective dependent claims.

A triangular signal in terms of the invention is each periodic signal, which comprises a strictly monotonously rising portion (in the following referred to as positive edge) and a directly following, strictly monotonously falling portion (in the following referred to as negative edge). This includes for example sawtooth signals.

A method is suggested, in which momentary values of a triangular signal are compared with a value of the measuring signal for generating a binary measurement pulse and momentary values of the triangular signal are compared with a predeterminable first reference variable for generating a binary reference pulse that corresponds to the measurement pulse. For example, the value of the measuring signal and the reference variable are monitored as threshold values for a triggering of positive and negative edges of rectangular pulses. Thus, the widths of the generated pulses correlate with the value of the measuring signal or the reference variable. Subsequently, the measurement pulse and the reference pulse are transmitted at a constant phase. After the transmission the value of the analogue measuring signal can be reconstructed either in analogue or digital manner from the pulse widths.

The method according to invention enables a transformation of the analogue measuring signal into two pulse-width modulated digital signals, which in terms of the invention are referred to as measurement pulse or reference pulse. By means of the method, at first, the value of the measuring signal is transformed with a low expenditure and a low loss of information into a frequency space. For this purpose no complex analogue/digital converter is needed. The first reference variable can be accurately generated for example with a reference voltage source. From the pulse widths the value of the analogue measuring signal can be reconstructed after the transmission with a low expenditure and a low loss of information.

During a period of the triangular signal the measuring signal should comprise merely a negligible change. Otherwise, advantageously the determined measurement and reference pulses should be rejected and the method should be repeated.

Preferably, the measurement pulse and reference pulse are generated in such a way that a ratio of a width of the measurement pulse to a width of the reference pulse corresponds to a ratio of the value of the measuring signal minus the first reference variable to a maximum value of the triangular signal minus the first reference variable:

$$\frac{M - R_1}{D_{Max} - R_1} = \frac{P_M}{P_R} \quad [1]$$

with M=measuring signal, $R_1$=first reference variable, $D_{Max}$=predetermined maximum value for triangular signal D, $P_M$=measurement pulse width, $P_R$=reference pulse width.

From these identical ratios the value of the measuring signal can be determined also in case of a non-constant frequency of the triangular signal with small error:

$$M = (D_{Max} - R_1) \times \frac{P_M}{P_R} + R_1 \quad [2]$$

As both pulses depend to the same degree on the frequency of the triangular signal, the frequency terms neutralize with the division. Any frequency change is compensated in such a way.

In a particularly preferred embodiment momentary values of the triangular signal are compared with a predeterminable constant second reference variable for generating the measurement pulse and for generating the reference pulse.

With a second reference variable the accuracy of the method can be clearly improved. The second reference variable can be accurately generated for example with a reference voltage source.

Here, advantageously, the measurement pulse and the reference pulse are generated such that a ratio of a width of the measurement pulse to a width of the reference pulse corresponds to a ratio of the value of the measuring signal minus the second reference variable to the first reference variable minus the second reference variable:

$$\frac{M - R_2}{R_1 - R_2} = \frac{P_M}{P_R} \quad [3]$$

with M=measuring signal, $R_1$, $R_2$=first, second reference variable, $P_M$ measurement pulse width, $P_R$=reference pulse width.

From this the measured variable can be reconstructed according to:

$$M = (R_1 - R_2) \times \frac{P_M}{P_R} + R_2 \quad [4]$$

As both pulses—reference pulse and measurement pulse—depend to the same degree on the frequency of the triangular signal, the frequency terms neutralize with the division. Any frequency change is compensated in such a way. In this embodiment, however, the reconstruction is more precise than with one reference variable only, since the second reference variable is predeterminable with a higher accuracy than the maximum value of the triangular signal.

A preferred form of embodiment provides that when comparing the momentary values of the triangular signal with the first reference variable a first binary intermediate reference pulse is generated. With the help of this intermediate reference pulse a pulse width ratio according to equation [3] can be produced at a low expenditure.

Furthermore, advantageously a second binary intermediate reference pulse is generated when comparing the momentary values of the triangular signal with the second reference variable. With the help of this intermediate reference pulse a pulse width ratio according to equation [3] can be produced at a low expenditure.

Preferably, for generating the reference pulse the first intermediate reference pulse is exclusive OR-linked with the second intermediate measurement pulse. This generates the reference pulse directly at a low expenditure and at a high processing speed.

Advantageously, when comparing the momentary values of the triangular signal with the value of the measuring signal a binary intermediate measurement pulse is generated. With the help of this intermediate measurement pulse a pulse width ratio can be produced according to equation [3] at a low expenditure.

Preferably, for generating the measurement pulse a second intermediate reference pulse is exclusive OR-linked with the intermediate measurement pulse. This generates the measurement pulse directly at a low expenditure and at a high processing speed.

Advantageously, the measurement pulse and the reference pulse are transmitted across a galvanic separation. Thus, a transition to another potential can be achieved.

In a preferred embodiment a sequence of measurement pulses and a sequence of reference pulses are generated and transmitted by repeated comparisons. Thus, also temporally variable measuring signals can be transmitted. Here, the sequences have the same frequency as the triangular signal.

The embodiment according to invention for the digital transmission of an analogue measuring signal comprises first means for comparing momentary values of a triangular signal with a value of the measuring signal for generating a binary measurement pulse, second means for comparing momentary values of the triangular signal with at least one predeterminable reference variable for generating a binary reference pulse and third means for transmitting the measurement pulse and the reference pulse at a constant phase. This arrangement realizes the method according to invention.

In a preferred form of embodiment the first means comprise a first comparator, which compares the momentary values of the triangular signal and the value of the measuring signal and which delivers a binary intermediate measurement pulse. A comparator generates the intermediate measurement pulse at a low expenditure.

Furthermore, a form of embodiment is preferred, in which the second means comprise a second comparator, which compares the momentary values of the triangular signal and the first reference variable and which delivers a first binary intermediate reference pulse. A comparator generates the first intermediate reference pulse at a low expenditure.

A third comparator, which compares momentary values of the triangular signal and a second reference variable and which delivers a second binary intermediate reference pulse, is advantageous. A comparator generates the second intermediate reference pulse at a low expenditure.

A preferred embodiment is characterized by means for the exclusive OR-linking of an intermediate measurement pulse with the second intermediate reference pulse for generating the measurement pulse. This allows for the direct generation of the measurement pulse at a low expenditure and at a high processing speed.

A further preferred embodiment is characterized by means for the exclusive OR-linking of a first intermediate reference pulse with the second intermediate reference pulse for generating the reference pulse. This allows for the direct, in-phase with the measurement pulse, generation of the reference pulse at a low expenditure and at a high processing speed.

A form of embodiment is favorable, in which the third means comprise a galvanic separation.

The advantages achieved with the invention consist in particular of the fact that a momentary value of a measuring signal can be transmitted at a low expenditure and at a low loss.

Figure 2:
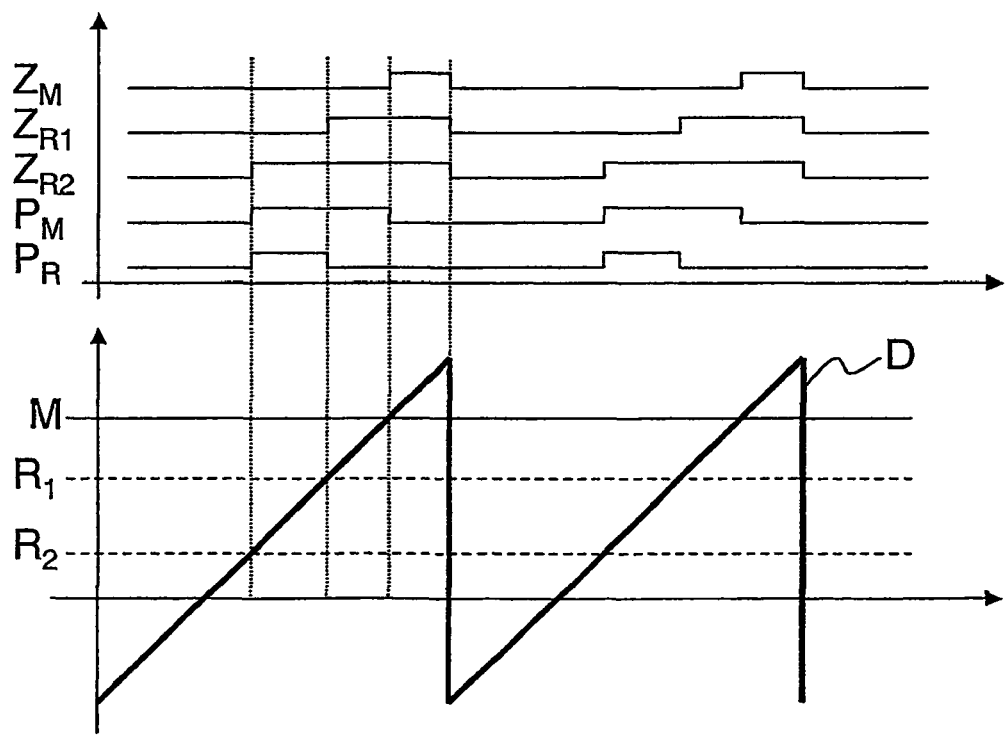
Figure 3:
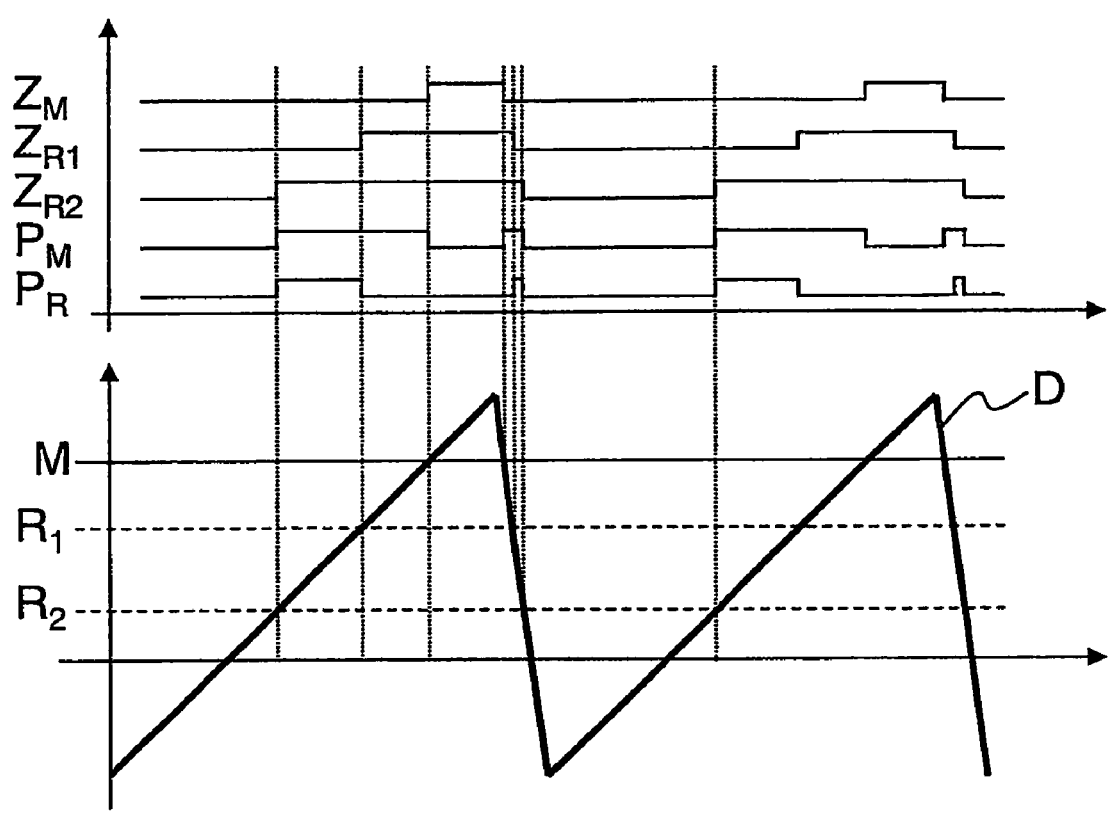
Figure 4:
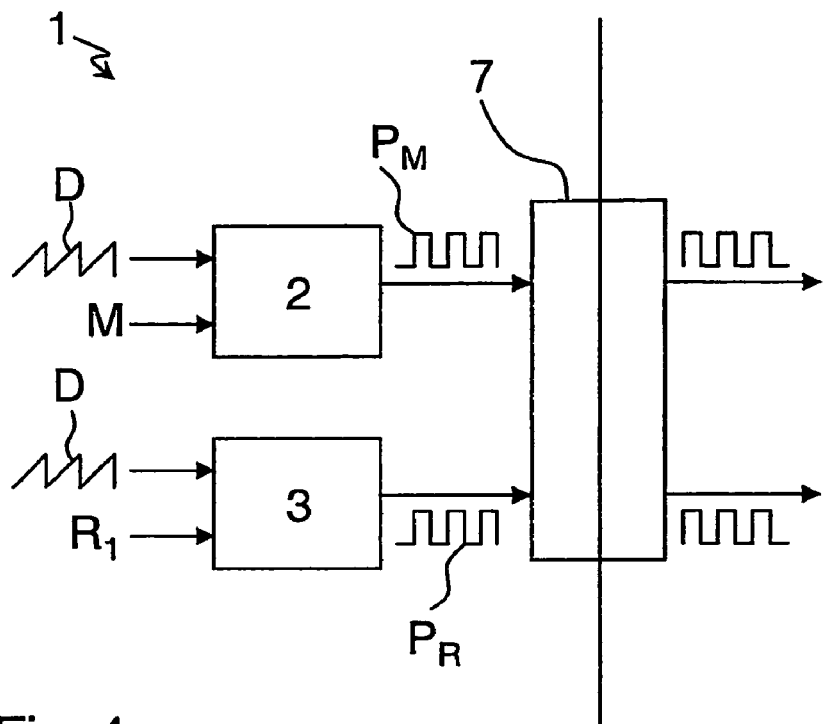
Figure 5:
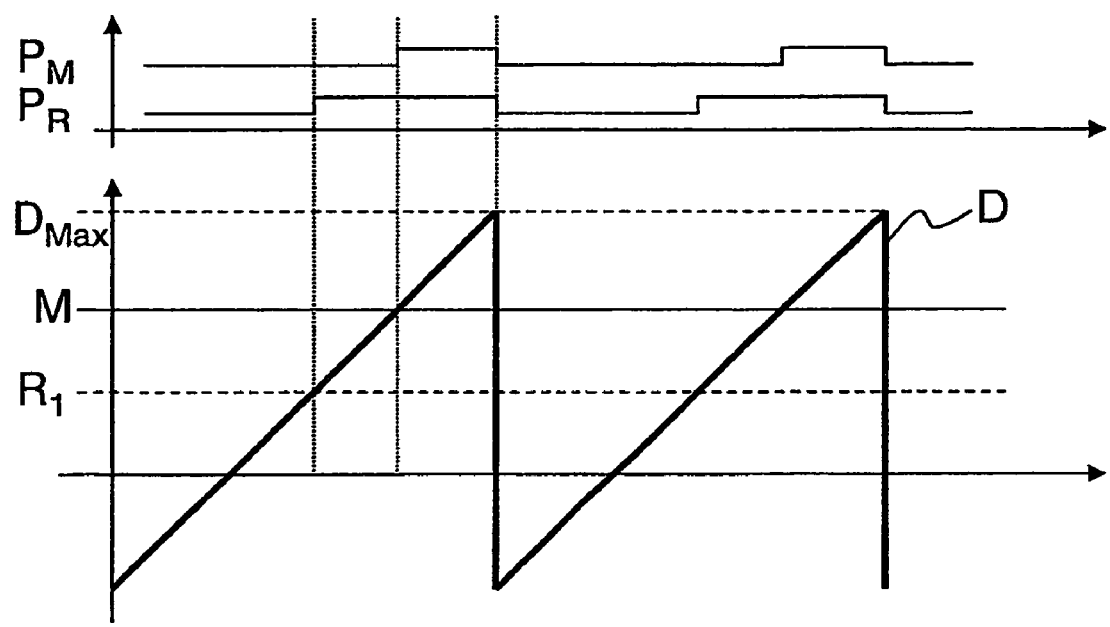

Examples of embodiment of the invention are described in detail on the basis of drawings, in which FIG. 1 shows a block diagram of a transmission arrangement, FIG. 2 shows schematic signal processes in the arrangement with one ideal sawtooth signal and two reference voltages, FIG. 3 shows schematic signal processes in the arrangement with one real triangular signal and two reference voltages, FIG. 4 shows a block diagram of a further transmission arrangement and FIG. 5 shows schematic signal processes in this arrangement with one ideal sawtooth signal and one reference voltage.

According elements are provided with like reference numerals in all Figures.

The arrangement 1 illustrated in FIG. 1 as a block diagram comprises three comparators 2, 3, 4, whose outputs are connected in pairs to the inputs of two XOR-gates 5, 6. The outputs of the XOR-gates 5 and 6 are transmitted by means of a digital data coupler 7 in galvanically separated manner to a microcontroller not shown. For this purpose, the data coupler 7 is embodied for instance as an optocoupler.

Moreover, a generator for a triangular signal D is not shown, whose output is connected to the first input of each comparator 2, 3, 4. The generator generates a triangular signal D, for example an ideal sawtooth signal with a frequency of 10 KHz and a range of values from −5 V to +12 V. For example during operation subject to ambient parameters such as temperature and pressure as well as subject to component tolerances the triangular signal D comprises low frequency fluctuations.

The shown arrangement 1 is used for example in a hybrid vehicle for an intermediate circuit voltage measurement in a high voltage range and for the transmission of the analogue voltage measurement values to the microcontroller arranged in a low-voltage range.

An analogue measuring signal M to be transmitted, which represents the voltage measurement values, is applied to the second input of the first comparator 2. In the given case the measuring signal M is constant at least for the duration of a period of the triangular signal D, for example it shall comprise a permanent constant value of 8 V.

To the second input of the second comparator 3 a first reference variable $R_1$ is applied in form of a voltage of for example 5 V, which is exactly predetermined for example by means of a reference voltage source not shown. Similarly, to the second input of the third comparator 4 a lower, second reference variable $R_2$ in form of a voltage of for example 2 V is applied, which is exactly predetermined for example by means of a further reference voltage source not shown.

The first comparator 2 compares the momentary values of the triangular signal D with the value of the measuring signal M and generates at its output accordingly a binary intermediate measurement pulse $Z_M$. The intermediate measurement pulse $Z_M$ is set to state "1", as soon as the triangular signal D exceeds the value of the measuring signal M, and is set to state "0", as soon as the triangular signal D falls below the value of the measuring signal M.

Accordingly, the second comparator 3 compares the momentary values of the triangular signal D with the first reference variable $R_1$ and generates at its output a first binary intermediate reference pulse $Z_{R1}$ subject to the respective comparison. The third comparator 4 compares the momentary values of the triangular signal D with the second reference variable $R_2$ and generates at its output accordingly a second binary intermediate reference pulse $Z_{R2}$ subject to the respective comparison.

The intermediate measurement pulse $Z_M$ and the second intermediate reference pulse $Z_{R2}$ are supplied to the first XOR-gate 5. Accordingly, the two intermediate reference pulses $Z_{R1}$, $Z_{R2}$ are supplied to the second XOR-gate 6. Both XOR-gates 5, 6 act within the pulse width of the second intermediate reference pulse $Z_{R2}$ as inverters. The first XOR-gate 5 inverts within this pulse width the intermediate measurement pulse $Z_M$ and delivers the measurement pulse $P_M$ as a result. The second XOR-gate 6 inverts within this pulse width the first intermediate reference pulse $Z_{R2}$ and delivers the reference pulse $P_R$. Both pulses $P_M$, $P_R$ are finally transmitted in galvanically separated manner by means of the data coupler 7.

In FIG. 2 the signals and signal processes occurring in the arrangement 1 are shown. It can be seen how the rising edge of the sawtooth signal triggers the intermediate pulses $Z_M$, $Z_{R1}$ and $Z_{R2}$ via the comparators 2, 3, 4. Then, it can be seen how the XOR-gates 5, 6 invert the intermediate measurement pulse $Z_M$ and the first intermediate reference pulse $Z_{R1}$ within the pulse width of the second intermediate reference pulse $Z_{R2}$. By means of this inversion the positive edges of measurement pulse $P_M$ and reference pulse $P_R$ occur simultaneously. For the ratio of the pulse widths, to simplify matters here also referred to as $P_M$ or $P_R$, from simple geometrical considerations ("intercept theorems") the equation [1] specified above results as follows:

$$\frac{M - R_2}{R_1 - R_2} = \frac{P_M}{P_R} \qquad [5]$$

Based on this relation from the pulse widths $P_M$, $P_R$ with the exactly known reference variables $R_1$, $R_2$ the value of the measuring signal M can be reconstructed with high accuracy according to the equation [4] specified above:

$$M = (R_1 - R_2) \times \frac{P_M}{P_R} + R_2 \qquad [6]$$

Because of the finite period duration of the triangular signal D the measuring signal M in the arrangement 1 is scanned worth-continuously, however time-discretely. Thus, all restrictions for time-discrete scanning shall apply, in particular for cases of high frequency changes of the measuring signal M, for example the Shannon Nyquist Theorem. However, by the continuous and in principle unlimited range of values a higher accuracy and thus a lower loss of information can be achieved during the transmission than when using a conventional, equally time-discrete analogue/digital converter in connection with a bit-wise, i.e. in addition worth-discrete transmission with conventional, constant pulse widths.

An exact analogue reconstruction from the pulse widths of measurement pulse $P_M$ and reference pulse $P_R$ can be effected with the aid of analogue circuits with a constant measuring signal M or a low change rate.

If the reconstruction is to be effected digitally, then at first in a discrete time measurement the pulse widths of measurement pulse $P_M$ and reference pulse $P_R$ must be determined, for example by means of a microcontroller with the aid of interrupts. Indeed, also such a time measurement shows quantization errors in form of a noise. However, such a digital time measurement can be effected with the same dissolution at a lower expenditure than a conventional analogue/digital conversion.

FIG. 3 shows signals and signal processes of the arrangement 1, if the latter is fed with a real triangular signal D. In this case the negative edge of the triangular signal D has a finite ascending slope. As a consequence by means of the inversion in the XOR-gates 5 and 6 in each case an additional state "1" results from an intermediate pulse $Z_M$ or $Z_{R1}$ at the end of the interval predetermined by the pulse width of the second intermediate reference pulse $Z_{R2}$. These additional states "1" can falsify the reconstruction. Therefore, they are appropriately filtered out from the measurement pulse $P_M$ or the reference pulse $P_R$ before the transmission or are ignored in case of a digital reconstruction. For this purpose, the additional states "1" can be identified and ignored by a receiving microcontroller for example while using a sequential logic, as their sequence is identical in all periods.

A simplified arrangement 1 is shown in FIG. 4, which apart from a digital data coupler 7 comprises merely two comparators 2, 3. XOR-gates are not necessary. At the first inputs of both comparators 2 and 3 an ideal sawtooth signal is applied as a triangular signal D with a range of values from 0 V up to a maximum value $D_{Max}$ of 10 V. The second input of the first comparator 2 is connected to the analogue measuring signal M to be transmitted. The second input of the first comparator 2 is connected to a constant predetermined reference variable $R_1$ in form of a voltage of 5 V. A second reference variable is not necessary. Intermediate pulses are not generated. The first comparator 2 generates directly the measurement pulse $P_M$. The second comparator 3 generates directly the reference pulse $P_R$.

FIG. 5 shows the signals and signal processes of the arrangement 1 from FIG. 4. The pulse widths are related to the equation [1] specified above according to the geometrical relations ("intercept theorems"):

$$\frac{M - R_1}{D_{Max} - R_1} \frac{P_M}{P_R} \qquad [7]$$

After the transmission via the data coupler 7 the measuring signal M can be reconstructed according to the equation [2] specified above:

$$M = (D_{Max} - R_1) \times \frac{P_M}{P_R} + R_1 \qquad [8]$$

In general, in arrangements not shown the transmission and galvanic separation can be effected for example by means of radio transmission.

LIST OF REFERENCE NUMERALS

1 Arrangement
2 First comparator
3 Second comparator
4 Third comparator
5 First XOR-gate
6 Second XOR-gate
7 Data coupler
D Triangular signal
$D_{Max}$ Maximum value
M Measuring signal
$R_1$ First reference variable
$R_2$ Second reference variable
$Z_M$ Intermediate measurement pulse
$Z_{R1}$ First intermediate reference pulse
$Z_{R2}$ First intermediate reference pulse
$P_M$ Measurement pulse
$P_R$ Reference pulse

The invention claimed is:

1. A method for the digital transmission of an analogue measuring signal (M), comprising the steps:
   comparing momentary values of a triangular signal (D) with a value of the measuring signal (M) for generating a binary measurement pulse ($P_M$),
   comparing momentary values of the triangular signal (D) with a predeterminable first reference variable ($R_1$) for generating a binary reference pulse ($P_R$) that corresponds to the measurement pulse ($P_M$) and
   transmitting a measurement pulse ($P_M$) and reference pulse ($P_R$) at a constant phase.

2. A method according to claim 1, characterized in that the measurement pulse ($P_M$) and the reference pulse ($P_R$) are generated such that a ratio of a width of the measurement pulse ($P_M$) to a width of the reference pulse ($P_R$) corresponds a ratio of the value of the measuring signal (M) minus the first reference variable ($R_1$) to a maximum value ($D_{Max}$) of the triangular signal (D) minus the first reference variable ($R_1$).

3. A method according to claim 1, characterized in that for generating the measurement pulse ($P_M$) and for generating the reference pulse ($P_R$) momentary values of the triangular signal (D) are compared to a predeterminable, constant second reference variable ($R_2$).

4. A method according to claim 3, characterized in that the measurement pulse ($P_M$) and the reference pulse ($P_R$) are generated such that a ratio of a width of the measurement pulse ($P_M$) to a width of the reference pulse ($P_R$) corresponds to a ratio of the value of the measuring signal (M) minus the second reference variable ($R_2$) to the first reference variable ($R_1$) minus the second reference variable ($R_2$).

5. A method according to claim 3, characterized in that when comparing the momentary values of the triangular signal (D) with the first reference variable ($R_1$) a first binary intermediate reference pulse ($Z_{R1}$) is generated.

6. A method according to claim 3, characterized in that when comparing the momentary values of the triangular signal (D) with the second reference variable ($R_2$) a second binary intermediate reference pulse ($Z_{R2}$) is generated.

7. A method according to claim 6, characterized in that for generating the reference pulse ($P_R$) a first intermediate reference pulse ($Z_{R1}$) is exclusive OR-linked with the second intermediate reference pulse ($Z_{R2}$).

8. A method according to claim 3, characterized in that when comparing the momentary values of the triangular signal (D) with the value of the measuring signal (M) a binary intermediate measurement pulse ($Z_M$) is generated.

9. A method according to claim 8, characterized in that for generating the measurement pulse ($P_M$) a second intermediate reference pulse ($Z_{R2}$) is exclusive OR-linked with the intermediate measurement pulse ($Z_M$).

10. A method according to claim 1, characterized in that the measurement pulse ($P_M$) and the reference pulse ($P_R$) are transmitted in galvanically separated manner.

11. A method according to claim 1, characterized in that by repeated comparisons a sequence of measurement pulses ($P_M$) and a sequence of reference pulses ($P_R$) are generated and transmitted.

12. An arrangement (1) for the digital transmission of an analogue measuring signal (M), in particular with a method according to claim 1, with first means for comparing momentary values of a triangular signal (D) with a value of the measuring signal (M) for generating a binary measurement pulse ($P_M$), second means for comparing momentary values of the triangular signal (D) with at least one predeterminable reference variable ($R_1$, $R_2$) for generating a binary reference pulse ($P_R$) and third means for transmitting the measurement pulse ($P_M$) and the reference pulse ($P_R$) at a constant phase.

13. An arrangement (1) according to claim 12, characterized in that the first means comprise a first comparator (2), which compares the momentary values of the triangular signal (D) and the value of the measuring signal (M) and which delivers a binary intermediate measurement pulse ($Z_M$).

14. An arrangement (1) according to claim 12, characterized in that the second means comprise a second comparator (3), which compares the momentary values of the triangular signal (D) and the first reference variable ($R_1$) and which delivers a first binary intermediate reference pulse ($Z_{R1}$).

15. An arrangement (1) according to claim 12, characterized by a third comparator (4), which compares momentary values of the triangular signal (D) and a second reference variable ($R_2$) and which delivers a second binary intermediate reference pulse ($Z_{R2}$).

16. An arrangement (1) according to claim 15, characterized by means for exclusive OR-linking of an intermediate measurement pulse ($Z_M$) with the second intermediate reference pulse ($Z_{R2}$) for generating the measurement pulse ($P_M$).

17. An arrangement (1) according to claim 15, characterized by means for exclusive OR-linking of a first intermediate reference pulse ($Z_{R1}$) with the second intermediate reference pulse ($Z_{R2}$) for generating the reference pulse ($P_R$).

18. An arrangement (1) according to claim 12, characterized in that the third means comprise a galvanic separation.

* * * * *